United States Patent [19]

Imamura et al.

[11] Patent Number: 5,389,817
[45] Date of Patent: Feb. 14, 1995

[54] SEMICONDUCTOR DEVICE HAVING A FLAT JUMPER LEAD

[75] Inventors: Tsutomu Imamura, Yokohama; Isao Baba, Fujisawa, both of Japan

[73] Assignee: Kabushiki Kaisha Toshiba, Kawasaki, Japan

[21] Appl. No.: 158,358

[22] Filed: Nov. 29, 1993

Related U.S. Application Data

[63] Continuation of Ser. No. 820,238, Jan. 14, 1992, abandoned.

[30] Foreign Application Priority Data

Jan. 18, 1991 [JP] Japan ................. 3-004632

[51] Int. Cl.⁶ .............. H01L 29/48; H01L 29/44; H01L 29/52; H01L 29/60
[52] U.S. Cl. .............. 257/666; 257/676
[58] Field of Search ............ 257/666, 691, 676, 668

[56] References Cited

U.S. PATENT DOCUMENTS

| | | | |
|---|---|---|---|
| 4,595,945 | 6/1986 | Graver | 257/676 |
| 4,951,122 | 8/1990 | Tsubosaki et al. | 357/72 |
| 4,989,068 | 1/1991 | Yasuhara et al. | 357/70 |
| 5,068,708 | 11/1991 | Newman | 357/70 |
| 5,089,879 | 2/1992 | Komenaka | 357/70 |
| 5,122,858 | 6/1992 | Mahulikar et al. | 357/70 |
| 5,126,821 | 6/1992 | Okinaga et al. | 357/70 |

FOREIGN PATENT DOCUMENTS

| | | |
|---|---|---|
| 0350833 | 1/1990 | European Pat. Off. |
| 62-136056 | 6/1987 | Japan |
| 1-124244 | 5/1989 | Japan |

OTHER PUBLICATIONS

W. C. Ward, "Volume Production of Unique Plastic Surface-Mount Modules for the IBM 80-ns 1-Mbit DRAM Chip by Area Wire Bond Techniques," May 9, 1988, pp. 552–557.

*Primary Examiner*—Edward Wojciechowicz
*Assistant Examiner*—S. V. Clark
*Attorney, Agent, or Firm*—Foley & Lardner

[57] ABSTRACT

A plastic package type semiconductor device comprises: a die pad consisting of a plurality of parts; a tab lead consisting of a plurality of parts holding the die pad; a flat type Jumper lead formed between the parts of the die pad; an electrical insulating type insulating film formed on the die pad; a semiconductor chip bonded on the insulating film by an adhesive; and a plastic mold as a plastic package for molding the die pad, the tab lead, the flat type Jumper lead, the insulating file, and the semiconductor device in the plastic mold, whereby the semiconductor chip is Insulated electrically from the die pad. In addition, a SOJ plastic package type semiconductor device has a configuration without the Jumper lead described above.

8 Claims, 5 Drawing Sheets

SEMICONDUCTOR DEVICE HAVING A FLAT JUMPER LEAD

This application is continuation of application Ser. No. 07/820,238, filed Jan. 14, 1992, now abandoned.

BACKGROUND OF THE INVENTION

1. Field of the Invention

The present invention relates to a plastic package type semiconductor device, and in particular, to a plastic package type semiconductor device comprising a semiconductor chip and a die pad section (also referred to as a bed section) mounted in close contact on an insulating film by the formation of the film on the die pad inside a lead frame to electrically insulate from each other.

2. Description of the Prior Art

FIG. 1 is a plan view of a lead frame contained in a conventional plastic package type semiconductor device. FIG. 2 is a sectional view showing the structure of the conventional plastic package type semiconductor device viewed along the section A-A' in FIG.1. As shown in the drawings, a die pad 1 is provided on which a semiconductor chip 3 is loaded.

Also provided are a plurality of tab leads 2, specifically, tie bars, and a Jumper lead 7b. As shown in FIG. 2, the Jumper lead 7b is formed in a U-shape to maintain the electrical resistance of the semiconductor chip 3. A bonding wire 9, an insulating adhesive 5 for electrically insulating and bonding tile die pad 1 to the semiconductor chip 3, and a plurality of inner leads 4 are also provided.

In addition, the die pad 1 is divided into two parts by the Jumper lead 7b. The surface of the die pad 1 is normally silver plated. An insulating adhesive 5 is used to bond the semiconductor chip 3 onto the die pad 1.

During the process of attaching the semiconductor chip 3 to the die pad 1, unbonded regions such as voids are formed in the insulating adhesive 5 used for bonding.

When a semiconductor device containing such unbonded regions is used for a long period of time, the silver plating on the die pad 1 migrates into the voids in the insulating adhesive 5 and eventually reaches the under surface (the surface bonded to the insulating adhesive 5) of the semiconductor chip 3.

The problem therefore arises that the electrical insulation between the die pad 1 and the semiconductor chip 3 is broken down by corrosion. In addition, in surface mounted type packages such as an SOP (Small Outline Package), an SOJ (Small Outline J-leaded Package), and the like, as shown in FIG. 3, there are cases in which cracks are produced in the package from VPS (Vapor Phase Soldering) fellow, IR (Infrared Ray) reflow, and the like. These cracks are caused by the absorption of moisture by the package so that steam is formed from heating during reflow, creating sufficient force to form cracks in the package.

The following problems are also associated with the conventional plastic package type semiconductor devices.

Taking a TSOP (Thin Small Outline Package) as a typical example, the thickness of the package has been reduced to the point where, at the present time, a thickness of as low as about 1.0 mm can be provided.

Specifically, FIG. 4 shows the cross sectional configuration of a TSOP in which the thickness A of the plastic mold is 0.28 mm, the thickness B of the semiconductor chip is 0.35 mm, the thickness C of the conductive adhesive is 0.05 mm, the thickness D of the lead frame is 0.15 mm, and the thickness E of the plastic mold is 0.17 mm. The total thickness F of the package is therefore 1.0 mm. However, when the package is to be used as a bank cash card or the like, a thickness of 0.8 mm or less is desirable. A problem therefore exists in that a semiconductor chip with a conventional structure cannot be used for a bank card or the like. If, in order to correct this problem, 0.1 mm is removed from both the top and bottom of the plastic so that the lower side is less than 0.15 mm thick, it is difficult to form the mold. Also, if the thickness of the chip is cut from 0.35 mm to 0.2 mm, the strength of the chip is reduced.

In addition, a reduction in the thickness of the lead frame is impossible from the aspect of strength and handling.

As explained in the foregoing, the problems associated with conventional plastic package type semiconductor devices may be summarized as follows in the conventional plastic package type semiconductor device, as a result of unbonded regions such as voids being formed during the manufacturing process, a breakdown in the electrical insulation in the resulting semiconductor device is possible, and cracking can occur in the package from fellow.

Furthermore, in surface mounted type packages such as an SOP or an SOP or the like, it is impossible to provide a package thickness of less than 1.0 mm which restricts the fields in which the package can be used.

SUMMARY OF THE INVENTION

Accordingly, an object of the present invention is to provide, with due consideration to the drawbacks of such conventional devices, a plastic package type semiconductor device wherein no voids or package cracks are produced. Accordingly, the destruction of electrical insulation between the die pad and the semiconductor chip in the plastic package type semiconductor device is prevented.

A further object of the present invention is to provide a thin plastic package type semiconductor device wherein there is no loss in package strength or in electrical Insulation properties.

A plastic package type semiconductor device, as a preferred embodiment according to the present invention, comprises:
- a die pad consisting of a plurality of parts;
- a tab lead consisting of a plurality of parts holding the die pad;
- a flat type Jumper lead formed between the parts of the die pad;
- an electrical insulating type insulating film formed on the die pad;
- a semiconductor chip bonded on the insulating film by an adhesive; and
- a plastic mold as a plastic package for molding the die pad, the tab lead, the flat type Jumper lead, the insulating file, and the semiconductor device in the plastic mold, whereby the semiconductor chip is insulated electrically from the die pad.

In addition, in the plastic package type semiconductor device described above the die pad consists of two parts.

Further, in the plastic package type semiconductor device described above each part of the die pad has a rectangle shape, and the parts of tab lead are provided along the long side and the short side of the plastic package.

Moreover, in the plastic package type semiconductor device described above each part of the die pad is of a U-shaped type, and the parts of tab lead are provided along the long side and the short side of the plastic package.

Furthermore, in the plastic package type semiconductor device described above, the parts of tab lead are provided along the long side and the short side of the plastic package, each part of the die pad is of a rectangle shape, the area of the die pad is smaller than that of the insulating film.

In addition, in the plastic package type semiconductor device described above, the parts of tab lead are provided only along the long side of the plastic package.

Furthermore, in the plastic package type semiconductor device described above, the parts of tab lead are provided only along the short side of the plastic package.

A small outline plastic package type semiconductor device, as another preferred embodiment according to the present invention, comprises:
 a die pad consisting of a plurality of parts;
 a tab lead consisting of a plurality of parts holding the die pad;
 an electrical insulating type insulating film formed on the die pad;
 a semiconductor chip bonded on the insulating film by an adhesive; and
 a plastic mold as a plastic package for molding the die pad, the tab lead, the insulating file, and the semiconductor device in the plastic mold,
 whereby the semiconductor chip is insulated electrically from the die pad.

These and other objects, features, and advantages of the present invention will become more apparent from the following description of the preferred embodiments taken in conjunction with the accompanying drawings.

DETAILED DESCRIPTION OF THE PREFERRED EMBODIMENTS

Other features of this Invention will become apparent in the course of the following description of exemplary embodiments which are given for illustration of the invention and are not intended to be limiting thereof. An embodiment of the present invention will now be described with reference to the drawings.

Figure 1:
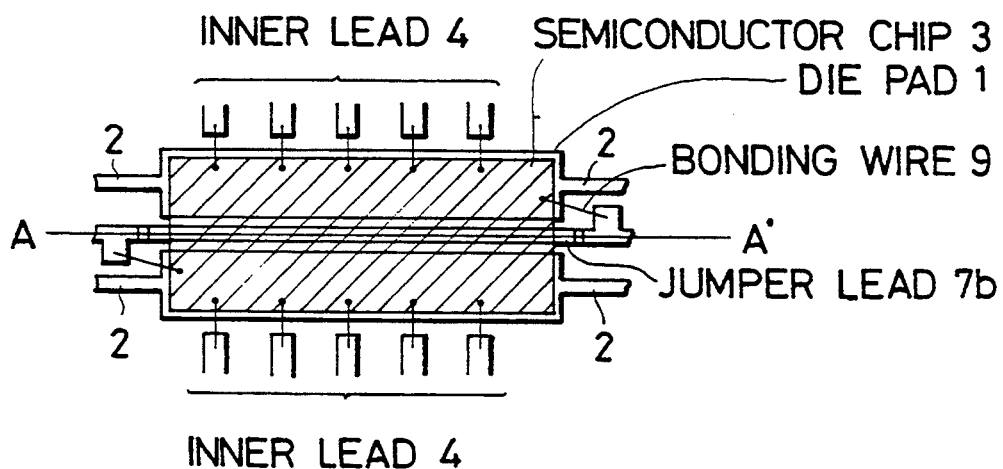
FIG. 1 is a plan view of a conventional plastic package type semiconductor device.
Figure 2:
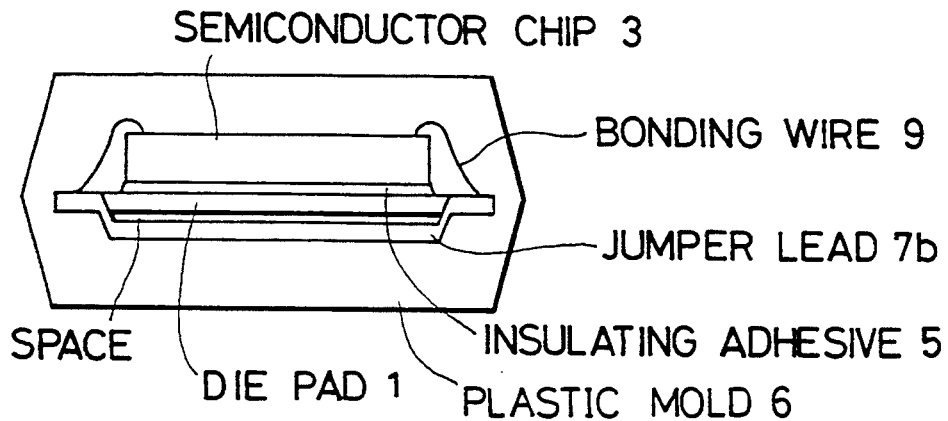
FIG. 2 is a sectional view of the conventional plastic package type semiconductor device viewed along the section A-A' in FIG. 1.
Figure 3:
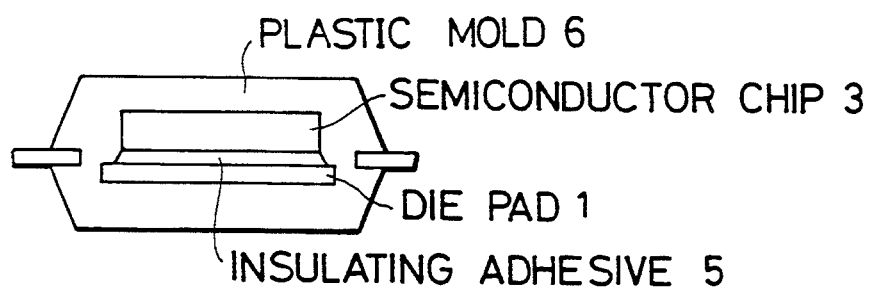
FIG. 3 is a sectional view of a surface mounted type package such as an SOP (Small Outline Package) or an SOJ (Small Outline J-leaded Package).
Figure 4:
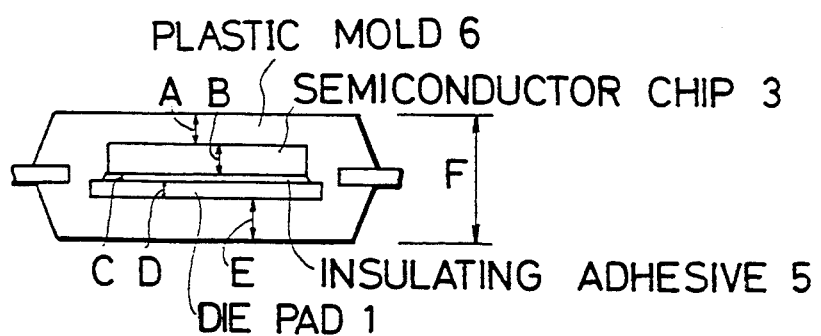
FIG. 4 is a view for explaining the thickness of each structural part of the plastic package type semiconductor device shown in FIG. 3.
Figure 5:
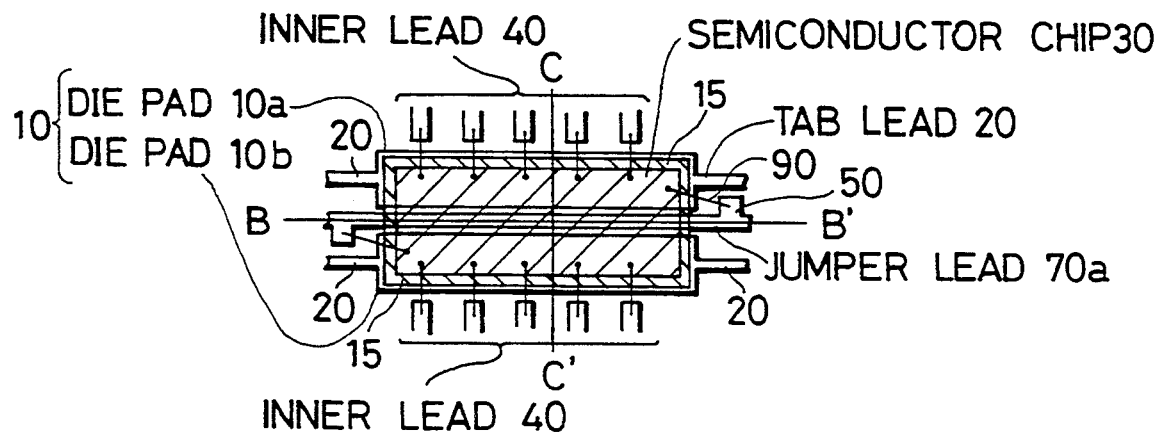
FIG. 5 is a plan view of one embodiment of the plastic package type semiconductor device of the present invention.

FIG. 5 is a plan view of a lead frame on one embodiment of the plastic package type semiconductor device of the present invention. As shown in the drawing, the plastic package type semiconductor device comprises a die pad 10, a plurality of tap leads 20, a semiconductor chip 30, a second bonding section 50, a Jumper lead (flat type) 70a, a bonding wire 90, an insulating film or a polycide tape 15, and a plurality of inner leads 40.

One of the features of this embodiment is that the Jumper lead 70a is a flat type and not the U-shaped type found in the conventional device. For this reason, it is possible to provide a plastic package type semiconductor device which is thinner than a conventional semiconductor device.

Figure 6:
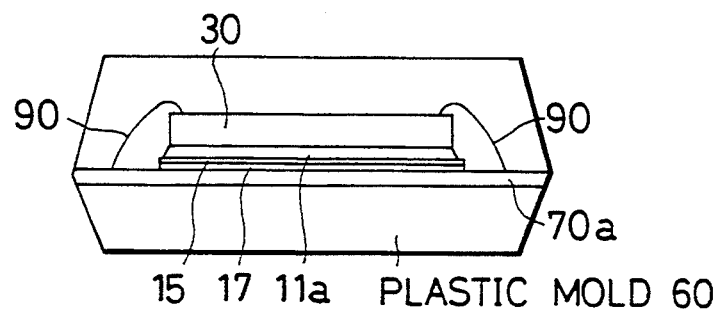
FIG. 6 is a sectional view of the embodiment of the plastic package type semiconductor device viewed along the section B-B' in FIG. 5.
Figure 7:
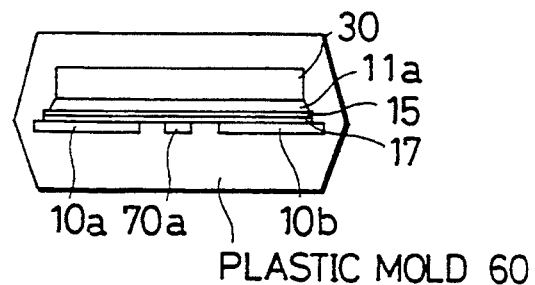
FIG. 7 is a sectional view of the embodiment of the plastic package type semiconductor device viewed along the section C-C' in FIG. 5.

FIG. 6 is a sectional view of the embodiment viewed along the section B-B' in FIG. 5, and FIG. 7 is a sectional view along the section C-C'. These two drawings show an insulating adhesive or a conductive adhesive 11a, a plastic mold 60, and an adhesive 17. As shown in the drawings, the insulating film 15 of the semiconductor device of the present invention is formed on the die pad 10 which is used as a lead frame, and the semiconductor chip 30 is bonded to the Insulating film 15 by means of the insulating adhesive or conductive adhesive 11a.

Following this, the semiconductor device is formed by the normal bonding, molding, and T/F (Trimming and Forming) processes.

Therefore, in this embodiment of the plastic package type semiconductor device, because a silver plating formed on the die pad 10, which is used as a lead frame, and the semiconductor chip 30 bonded by means of the insulating adhesive or conductive adhesive 11a awe not electrically conductive because of the insulating film 15 attached to the die pad 10, it is possible to prevent corrosion of the silver plating on the die pad 10. Furthermore, by forming the insulating film 15, it is possible to provide a flat type of Jumper lead 70a so that a thin semiconductor device can be provided.

FIG. 8A to FIG. 8D show other embodiments of the plastic package type semiconductor device of the present invention. As illustrated in the drawings, a die pad 100 is divided into two parts (100a, 100b) so that it is possible to adequately disperse the thermal stress within the package during reflow. In addition, a plurality of tab leads 200 is provided so that any steam generated during the above mentioned fellow is adequately discharged from the package.

Accordingly, it is possible to prevent the formation of cracks in the package from the reflow. Die pads 100(100a,100b),110(110a,110b),120(120a,120b),130(130a,130b) of various configurations are shown In FIG. 8A to FIG. 8D. The insulating film 15, which is one of the features of the present invention, is for example, a polycide tape. Because the insulating film 15 is provided, the die pad sections 100, 110, 120, 130 are completely insulated electrically from the semiconductor chip 300, therefore voids which occur during the manufacturing process and cracks which form in the package after completion of the product can be prevented, making it possible to provide a thin plastic package type semiconductor device free from such defects.

Figure 8A:
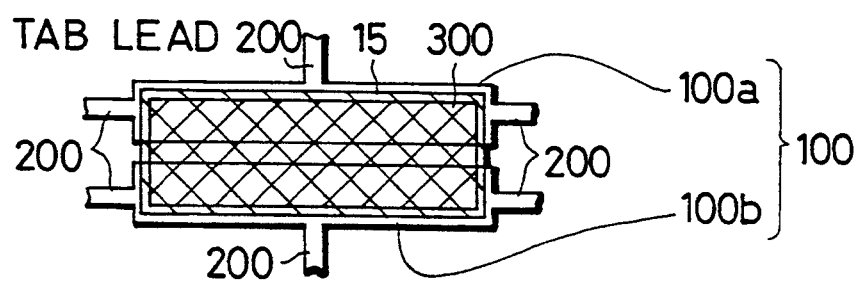
FIG. 8A to FIG. 8D are plan views of other embodiments of plastic package type semiconductor devices of the present invention using die pads of various structural types.
Figure 8B:
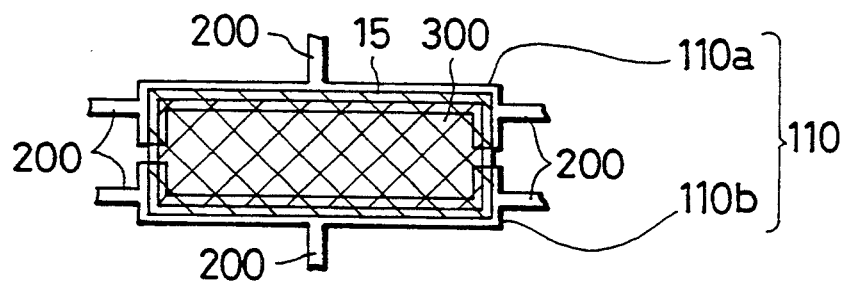
Figure 8C:
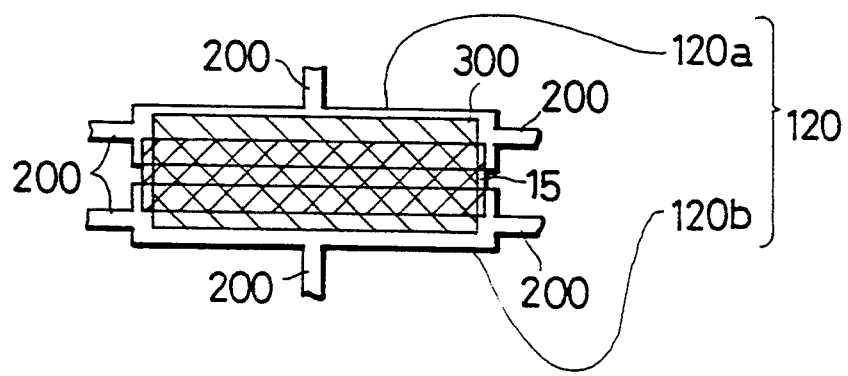
Figure 8D:
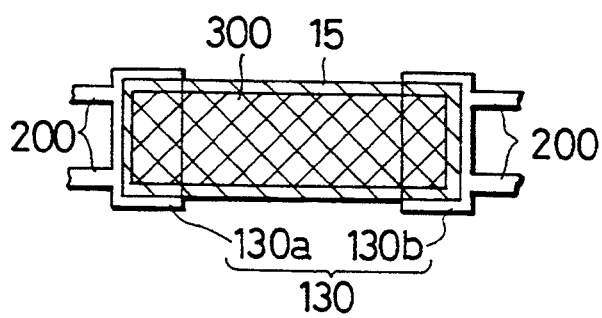

In FIG. 8A, the die pad 100 is a rectangular type; in FIG. 8B, the die pad 110 is a U-shaped type; in FIG. 8C, the die pad 120 is a rectangular type; and in all these cases the area of the insulating film 15 is smaller than that of the semiconductor chip 300; and in FIG. SD, the die pad 130 is supported only by the two sides of the semiconductor chip 300. However, the present invention is not limited to semiconductor devices with die pads of these configurations.

In the above-described embodiments of the plastic package type semiconductor device of the present invention, the large-area die pad 1 found in the conventional device is unnecessary.

Figure 9A:
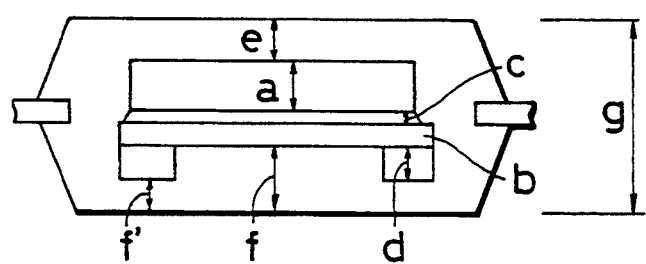
FIG. 9A and FIG. 9B are views for explaining the thickness of each structural part of the plastic package type semiconductor devices shown in FIG. 8A to FIG. 8B.
Figure 9B:
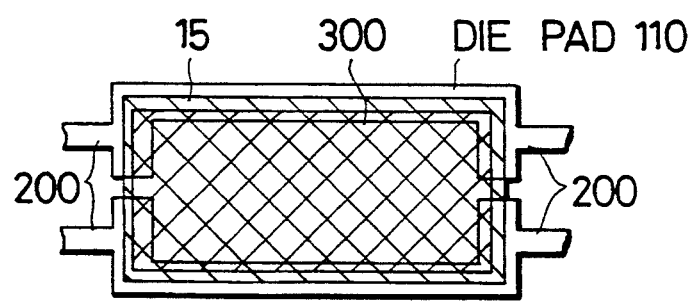

For example, with the configuration shown in FIG. 9A and FIG. 9B, the thickness "a" of the semiconductor chip is 0.35 mm, the thickness "b" of the insulating film is 0.02 mm, the thickness "c" of the insulating/conductive adhesive is 0.03 mm, the thickness "d" of the lead frame is 0.15 mm, tile thickness "e" of the plastic mold is 0.2 mm, the thickness "f" of the plastic mold is 0.2 mm, and the thickness "f" of the plastic mold is 0.05 mm. The total thickness "g" of the package is therefore 0.8 mm. Accordingly, this semiconductor device can be used in the field of bank cards and the like in which an ultrathin type package is required.

By means of the present invention as described above, a semiconductor device with an ultrathin type package is provided wherein the die pad and the semiconductor chip are completely insulated electrically by the insulating film, and the breakdown of the electrical insulation of the semiconductor chip from the silver coating of the die pad can be prevented.

In addition, no cracks are produced in the package as a result of fellow. Further, because it is possible to form the flat type of Jumper lead under the semiconductor chip, with no depression, rather than the conventional type which has a depression, the lead frame process can also be shortened, with an accompanying reduction in cost.

The present invention is, however, not restricted to this embodiment. For example, it is possible to fabricate a plastic package type semiconductor device with a structure which combines the first and second embodiments.

It is also possible to employ a plastic package type semiconductor device with a chip-on-lead (COL) structure, or a device with a lead-on-chip (LOC) structure.

Various modifications will become possible for those skilled in the art after the teaching of the present disclosure without departing from the scope thereof.

What is claimed is:

1. A plastic package type semiconductor device comprising:
    a die pad having a plurality of parts;
    a tab lead having a plurality of parts holding the die pad;
    a flat type jumper lead formed between the parts of the die pad;
    an electrical insulating film formed on both the die pad and the flat type jumper lead;
    a semiconductor chip bonded on the insulating film by an adhesive; and
    a plastic mold as a plastic package for molding the die pad, the tab lead, the flat type jumper lead, the insulating film, and the semiconductor chip in the plastic mold,
    wherein the flat type jumper lead is electrically insulated from the semiconductor chip by the insulating film, and the thickness of the jumper lead is approximately equal to the thickness of the die pad.

2. A plastic package type semiconductor device according to claim 1, wherein the die pad consists of two parts.

3. A plastic package type semiconductor device according to claim 2, wherein each of said parts of the die pad has a rectangular shape, and the parts of the tab lead are provided along a long side and along a short side of the plastic package.

4. A plastic package type semiconductor device according to claim 2, wherein each of said parts of the die pad has a U-shape, and the parts of the tab lead are provided along a long side and along a short side of the plastic package.

5. A plastic package type semiconductor device according to claim 2, wherein the parts of the tab lead are provided only along a long side of the plastic package.

6. A plastic package type semiconductor device according to claim 2, wherein the parts of the tab lead are provided only along a short side of the plastic package.

7. A small outline plastic package type semiconductor device comprising:
    a die pad having a plurality of parts;
    a tab lead having a plurality of parts holding the die pad;
    an electrical insulating type insulating film formed on the die pad;
    a semiconductor chip bonded on the insulating film by an adhesive; and
    a plastic mold as a plastic package for molding the die pad, the tab lead, the insulating film, and the semiconductor chip in the plastic mold,
    wherein the die pad is electrically insulated from the semiconductor chip by the insulating film.

8. A plastic package type semiconductor device comprising:
    a die pad having a plurality of parts;
    a tab lead having a plurality of parts holding the die pad;
    a flat type jumper lead formed between the parts of the die pad;
    an electrical insulating film formed on both the die pad and the flat type jumper lead;
    a semiconductor chip bonded on the insulating film by an adhesive; and
    a plastic mold as a plastic package for molding the die pad, the tab lead, the flat type jumper lead, the insulating film, and the semiconductor chip in the plastic mold,
    wherein the flat type jumper lead is electrically insulated from the semiconductor chip by the insulating film, and the thickness of the jumper lead is approximately equal to the thickness of the die pad,
    and the parts of the tab lead are provided along a long side and along a short side of the plastic package, each of said parts of the die pad having a rectangular shape, and the area of the die pad is larger than the area of the insulating film.

* * * * *